(12) United States Patent
Kim

(10) Patent No.: US 8,399,984 B2
(45) Date of Patent: Mar. 19, 2013

(54) SEMICONDUCTOR PACKAGE

(75) Inventor: Seong Cheol Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 609 days.

(21) Appl. No.: 12/640,125

(22) Filed: Dec. 17, 2009

(65) Prior Publication Data

US 2010/0289136 A1   Nov. 18, 2010

(30) Foreign Application Priority Data

May 12, 2009   (KR) .................... 10-2009-0041227

(51) Int. Cl.
*H01L 23/10* (2006.01)
*H01L 23/34* (2006.01)

(52) U.S. Cl. ................ 257/707; 257/714; 257/686

(58) Field of Classification Search .......... 257/706, 257/707, 714, 686, 777, 723, 724
See application file for complete search history.

(56) References Cited

U.S. PATENT DOCUMENTS

| | | | | |
|---|---|---|---|---|
| 7,608,924 B2 * | 10/2009 | Myers et al. | ............. | 257/714 |
| 7,928,563 B2 * | 4/2011 | Bakir et al. | ............. | 257/713 |
| 8,159,065 B2 * | 4/2012 | Suh et al. | ............. | 257/712 |
| 2004/0140547 A1 * | 7/2004 | Yamazaki et al. | ............. | 257/686 |
| 2004/0152240 A1 * | 8/2004 | Dangelo | ............. | 438/122 |
| 2009/0267194 A1 * | 10/2009 | Chen | ............. | 257/621 |

FOREIGN PATENT DOCUMENTS

| | | |
|---|---|---|
| KR | 10-0842910 B1 | 6/2008 |
| KR | 10-0874910 B1 | 12/2008 |
| KR | 10-0895813 B1 | 5/2009 |
| KR | 10-0896883 B1 | 5/2009 |

* cited by examiner

*Primary Examiner* — S. V Clark
(74) *Attorney, Agent, or Firm* — Ladas & Parry LLP

(57) ABSTRACT

A semiconductor package comprises a semiconductor chip, through electrodes and cooling parts. The semiconductor chip has bonding pads on an upper surface thereof. The through-electrodes are formed in the semiconductor chip. The cooling parts are formed in the semiconductor chip and on the upper surface of the semiconductor chip in order to dissipate heat.

18 Claims, 3 Drawing Sheets

SEMICONDUCTOR PACKAGE

CROSS-REFERENCE TO RELATED APPLICATIONS

The present application claims priority to Korean patent application number 10-2009-0041227 filed on May 12, 2009, which is incorporated herein by reference in its entirety.

BACKGROUND OF THE INVENTION

The present invention relates to a semiconductor package, and more particularly, to a semiconductor package which can dissipate heat.

In the semiconductor industry, packaging technology for integrated circuits is continuously being developed to satisfy the demands for miniaturization and mounting reliability. For example, the demand for miniaturization has expedited the development of various techniques for obtaining a package having a size is approaching that of the very chip included in the semiconductor package. The demand for mounting reliability has elevated the importance of packaging techniques with improved efficiency of mounting work and mechanical and electrical reliability after mounting.

With respect to demands for miniaturization and high performance in electric and electronic products, different techniques for providing a semiconductor module of high capacity have become necessary. A method for providing a semiconductor module of high capacity requires high integration of a memory chip. The high integration of a memory chip can be accomplished by integrating an increased number of cells in a limited space of the semiconductor chip.

However, high integration of a memory chip requires high precision techniques, such as a fine line width, and a lengthy development period. Due to the constraints of these high precision techniques, stacking techniques have been proposed as another method for providing a semiconductor module of high capacity.

Stacking techniques include a method of disposing two to stacked chips in one package, and a method of stacking two separately packaged chips. Recently, a method has been proposed, in which through-electrodes made of a conductive material such as copper are formed in semiconductor chips such that the semiconductor chips can be stacked in such a way as to be is electrically connected through the through-electrodes.

In the stack package realized using the through-electrodes, heat is necessarily generated as the stacked semiconductor chips operate, and, due to this fact, operation defects result. Therefore, in order to dissipate the heat generated during the operation of the semiconductor chips, a method of forming microchannels in the semiconductor chips has been suggested.

However, semiconductor chips formed with microchannels have disadvantages, in that it is difficult to manufacture a semiconductor chips with the microchannels. Further, due to the formation of the microchannels in the semiconductor chips, the number of manufacturing processes increases, by which the manufacturing costs increase and a manufacturing time is lengthened. Also, due to the formation of the microchannels in the semiconductor chips, the strength of the semiconductor chips deteriorates, and thus the probability of damage to the semiconductor chip is increased both during subsequent manufacturing processes and after packaging is completed.

BRIEF SUMMARY OF THE INVENTION

Embodiments of the present invention include a semiconductor package which can easily dissipate heat without an increase in the number of manufacturing processes.

Also, embodiments of the present invention include a semiconductor package which can prevent an increase in the is manufacturing cost and a lengthened manufacturing time by preventing the number of manufacturing processes from increasing.

Further, embodiments of the present invention include a semiconductor package which can easily dissipate heat without increasing the chances of damage to the semiconductor chip.

In one embodiment of the present invention, a semiconductor package comprises a semiconductor chip having bonding pads on an upper surface thereof; a through-electrode formed in the semiconductor chip; and a cooling part formed in the semiconductor chip and on the upper surface of the semiconductor chip.

The semiconductor package may further comprise a redistribution line formed on the upper surface of the semiconductor chip in such a way as to electrically connect the bonding pads to the through-electrodes.

The cooling part may comprises a first cooling unit which is formed in the semiconductor chip so as to surround the through-electrode and a second cooling unit which is formed on the upper surface of the semiconductor chip.

The first cooling unit may be formed to contact the through-electrode or to be separated from the through-electrode.

The first cooling part is connected to the second cooling part.

In another embodiment of the present invention, a semiconductor package comprises at least two semiconductor chips each formed with a through-electrode therein and stacked such that the through-electrodes are electrically connected to each other; a first cooling part formed in and on an upper surface of each of the at least two semiconductor chips; a substrate to be attached the stacked semiconductor chips thereto and having a bond finger which is connected to the through-electrode of a lowermost semiconductor chip of the at least two semiconductor chips; and a second cooling part formed on an upper surface of the substrate, including the periphery of the bond finger.

The first cooling parts of the stacked semiconductor chips are connected to each other and to the second cooling part.

The semiconductor package may further comprise a sealing member interposed between the first cooling parts of any two stacked semiconductor chips of the at least two semiconductor chips and interposed between the first cooling part of the lowermost semiconductor chip of the at least two semiconductor chips and the second cooling part so as to physically join the cooling parts.

The sealing members may comprise polymer.

The first cooling parts may comprise a first cooling unit which is formed in the semiconductor chip so as to surround the through-electrodes and a second cooling unit which is formed on the upper surface of the semiconductor chip.

The first cooling unit may be formed to contact the is through-electrodes or to be separated from the through-electrodes.

The first cooling part is connected to the second cooling unit.

The second cooling part may include an inlet or outlet portion which is disposed on an edge of the substrate.

In another embodiment of the present invention, a semiconductor package comprises at least two semiconductor chips each formed with a through-electrode therein and stacked such that the through-electrodes are electrically connected to each other; a first cooling part formed on an upper surface of each of the at least two semiconductor chips; a substrate to be attached the stacked semiconductor chips thereto and having a bond finger which is connected to the through-electrode of a lowermost semiconductor chip of the at least two semiconductor chips; a second cooling part formed on an upper surface of the substrate, including the periphery of the bond finger; and a third cooling part disposed on a side surface of the stacked semiconductor chips and connected to both the first cooling parts of the at least two semiconductor chips and the second cooling part.

The first cooling parts, the second cooling part, and the third cooling part are connected to each other.

The semiconductor package may further comprise sealing members interposed between the first cooling parts and the third cooling parts and between the second cooling parts and the third is cooling part so as to physically join the cooling parts.

The sealing members may comprise polymer.

The second cooling parts may include an inlet or outlet portion which is disposed on an edge of the substrate.

DESCRIPTION OF SPECIFIC EMBODIMENTS

Hereafter, specific embodiments of the present invention will be described in detail with reference to the accompanying drawings.

It is understood herein that the drawings are not necessarily to scale and in some instances proportions may have been exaggerated in order to more clearly depict certain features of the invention.

Figure 1:
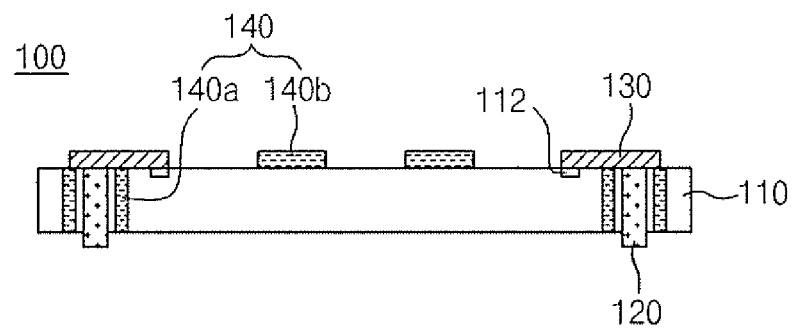
FIGS. 1 and 2 are cross-sectional views showing a semiconductor package in accordance with an embodiment of the present invention.

FIG. 1 is a cross-sectional view illustrating a is semiconductor package in accordance with an embodiment of the present invention.

Referring to FIG. 1, a semiconductor package 100 in accordance with an embodiment of the present invention includes a semiconductor chip 110 which has bonding pads 112 formed on the upper surface thereof, through-electrodes 120 which are formed in the semiconductor chip 110, redistribution lines 130 which are formed on the upper surface of the semiconductor chip 110 in such a way as to electrically connect the bonding pads 112 to the through-electrodes 120, and cooling parts 140 which are formed in the semiconductor chip 110 and on the upper surface of the semiconductor chip 110.

Figure 2:
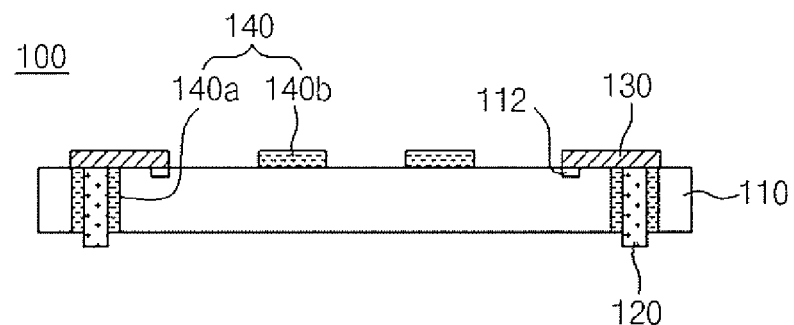

The cooling parts 140 include first cooling units 140a which are formed in the semiconductor chip 110 so as to surround the through-electrodes 120, and second cooling units 140b which are formed on the upper surface of the semiconductor chip 110. In an embodiment of the present invention, the first cooling units 140a and the second cooling units 140b are connected with each other (FIG. 2).

The first cooling units 140a, which are formed to surround the through-electrodes 120, can be formed, for example, by defining vias for the first cooling units 140a in the semiconductor chip 110 when forming the through-electrodes 120, and then, by filling a cooling material as a fluid in the vias.

The second cooling units 140b, which are formed on the upper surface of the semiconductor chip 110, can be formed over the overall area of the semiconductor chip 110 with a metal as Ti, TiW, NiV and Cu etc., and through this, the dissipation of heat generated from the through-electrodes 120 and in the semiconductor chip 110 can be reliably implemented.

As can be readily seen from the above description, in the semiconductor package in accordance with an embodiment of the present invention, due to the fact that cooling parts are formed around through-electrodes and on the upper surface of the semiconductor package, not only the heat generated from the through-electrodes but also the heat generated in the semiconductor chip can be quickly and reliably dissipated.

Therefore, in the semiconductor package in accordance with an embodiment of the present invention, it is possible to limit the number of manufacturing processes, the manufacturing costs and the manufacturing time relative to the formation of microchannels.

Although it was illustrated in the semiconductor package 100 in accordance with the embodiment of the present invention shown in FIG. 1, that the first cooling units 140a surrounding the through-electrodes 120 are formed to be separated from the through-electrodes 120 1, it can be envisaged that the first cooling units 140a are formed to contact the through-electrodes 120 as is shown in FIG. 2. For example, in the embodiment of the present invention shown in FIG. 1, the first cooling units are formed as to surround the through electrode while being separated form the through electrodes. In FIG. 1, a space is left interposed between the first cooling unit and the through electrode, with the space surrounding the through electrode. In another embodiment, the first cooling unit at least partially contacts the through electrode, such as the first cooling unit shown in FIG. 2.

In this case, the dissipation of the heat generated from the through-electrodes 120 can occur quickly.

In FIG. 2, the unexplained component elements are the same as those of FIG. 1, and therefore, a detailed description thereof will be omitted for brevity.

Figure 3:
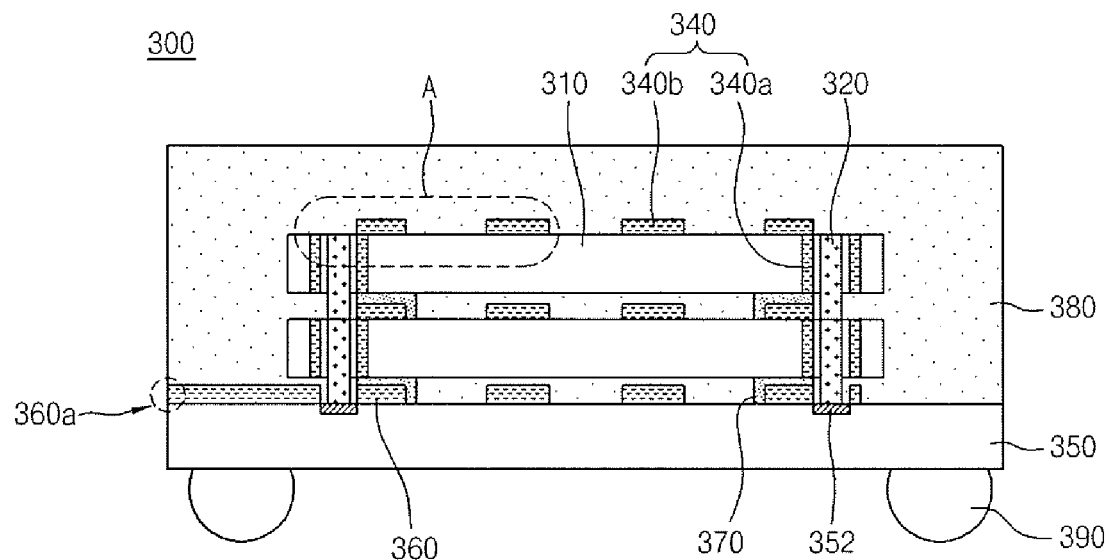
FIG. 3 is a cross-sectional view showing a semiconductor package having a stack structure in accordance with another embodiment of the present invention.
Figure 4:
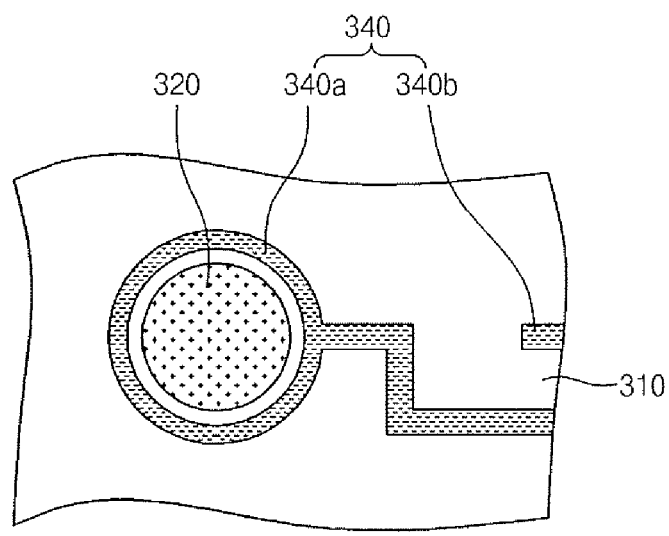
FIG. 4 is a plan view showing the part 'A' of FIG. 3.

FIG. 3 is a cross-sectional view showing a semiconductor package having a stack structure in accordance with another embodiment of the present invention, and FIG. 4 is a plan view showing the part 'A' of FIG. 3.

Referring to FIGS. 3 and 4, a semiconductor package 300 having a stack structure in accordance with another embodiment of to the present invention includes at least two semiconductor chips 310, a substrate 350 on which the semiconductor chips 310 are vertically stacked, an encapsulant member 380 which seals the upper surface of the substrate 350 including the stacked semiconductor chips 310, and external connection terminals 390 which are attached to the is lower surface of the substrate 350.

Each semiconductor chip 310 has bonding pads (not shown) disposed on the upper surface thereof, and is formed with through-electrodes 320 therein. First cooling parts 340 are formed in and on the upper surface of each semiconductor chip 310. The first cooling parts 340 include first cooling units 340a, which are formed in the semiconductor chip 310 so as to surround the through-electrodes 320, and second cooling units 340b, which are formed on the upper surface of the semiconductor chip 310. In an embodiment, the first cooling units 340a and the second cooling units 340b are connected with each other. The semiconductor chips 310 are vertically stacked such that their through-electrodes 320 are connected.

While not shown in a drawing, each of the stacked semiconductor chips 310 has bonding pads disposed on the upper surface thereof. The bonding pads can, for example, be electrically connected to the through-electrodes directly or by the medium of redistribution lines.

The substrate 350 has a plurality of bond fingers 352 disposed on the upper surface thereof and is formed with second cooling parts 360 on the upper surface thereof. The second cooling parts 360 have inlet or outlet portions 360a which are disposed on edges of the substrate 350. The second cooling parts 360 having the inlet or outlet portions 360a can be arranged throughout the is surface of the substrate 350, excluding any portion of the substrate having the bond fingers 352 which are bonded to the through-electrodes 320 of the lowermost semiconductor chip 310. Here, the fluid consisting of the first cooling units 340a may be supplied in the vias for the first cooling units 340a of the semiconductor chips 310 through inlet or outlet portions 360a of the substrate 350. In an embodiment, the second cooling parts 360 are formed at the peripheries of the bond fingers. The bond fingers 352 of the substrate 350 are disposed at positions corresponding to the through-electrodes 320 of the semiconductor chip 320. Therefore, the bond fingers 352 of the substrate 350 are electrically connected to the through-electrodes 320 of the lowermost semiconductor chip 310 among the stacked semiconductor chips 310.

When stacking the semiconductor chips 310 so as to form connections between the through-electrodes 320, the first cooling parts 340 of the different chips are also connected to each other. The first cooling parts 340 of the lowermost semiconductor chip 310 are connected to the second cooling parts 360 of the substrate 350. In an embodiment, the connection between the first cooling parts 340 of different chips, and the connection between the first cooling parts 340 of the lowermost chip and the second cooling parts 360, are implemented by the medium of sealing members 370 made of polymer.

The encapsulant member 380 is formed to seal the upper surface of the substrate 350 including the at least two vertically stacked semiconductor chips 310 so as to protect the semiconductor chips 310 from external stresses. The encapsulant member 380 can comprise, for example, an EMC (epoxy molding compound).

The external connection terminals 390 are attached to ball lands (not shown) which are disposed on the lower surface of the substrate 350, as mounting means to external circuits. For example, solder balls can be used as the external connection terminals 390.

In the semiconductor package having the stack structure in accordance with an embodiment of the present invention, due to the fact that the cooling parts are formed around the through-electrodes, the heat generated from the through-electrodes can be easily dissipated to an outside. Also, it is possible to minimize the number of manufacturing processes, the manufacturing costs and the manufacturing time relative to a semiconductor device having microchannels.

Moreover, in the semiconductor package having the stack structure in accordance with an embodiment of the present invention, due to the fact that all the cooling parts are connected to each other and the inlet or outlet portions define heat dissipation paths, the heat dissipation characteristics can be remarkably improved when compared to the conventional art, and the size of is the semiconductor package can be reduced when compared to the conventional art.

Also, in the semiconductor package having the stack structure in accordance with an embodiment of the present invention, since it is not necessary to define microchannels in the semiconductor chips to cool the semiconductor chips, the strength of the semiconductor chips is not reduced when implementing the cooling structure, whereby the semiconductor chips can be prevented from being damaged.

Figure 5:
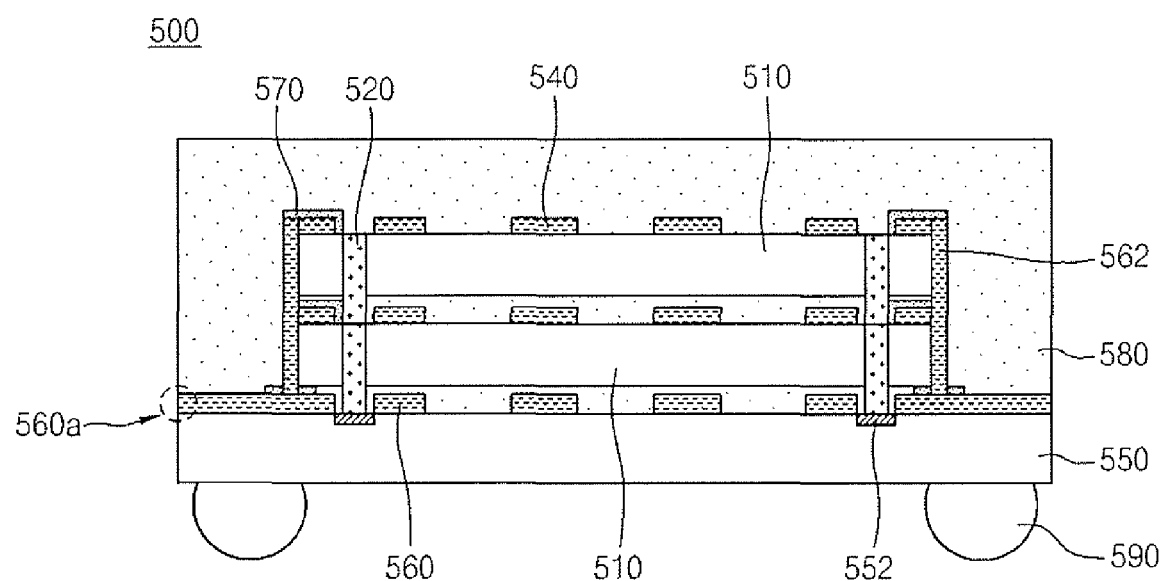
FIG. 5 is a cross-sectional view showing a semiconductor package having a stack structure in accordance with another embodiment of the present invention.

FIG. 5 is a cross-sectional view showing a semiconductor package having a stack structure in accordance with another embodiment of the present invention.

Referring to FIG. 5, a semiconductor package 500 having a stack structure in accordance with another embodiment of the present invention includes at least two semiconductor chips 510, a substrate 550 on which the semiconductor chips 510 are vertically stacked, an encapsulant member 580 which seals the upper surface of the substrate 550 including the stacked semiconductor chips 510, external connection terminals 590 which are attached to the lower surface of the substrate 550, and third cooling parts 562 which are disposed on both side surfaces of the stacked semiconductor chips 510.

Each of the semiconductor chips 510 has bonding pads (not shown) on the upper surface thereof and is formed with is through-electrodes 520. First cooling parts 540 are structured in a manner such that they are formed only on the upper surface of each semiconductor chip 510, differently from the aforementioned embodiment in which the first cooling parts are formed in and on the upper surface of each semiconductor chip. Namely, in the embodiment, the semiconductor chips 510 have structures in which only second cooling units are formed on the upper surfaces of the semiconductor chips 510 without the formation of first cooling units to surround the through-electrodes 520. Such a structure can be understood to relieve the process difficulties caused when forming the first cooling units around the through-electrodes and further as preventing the occurrence of defects. The first cooling parts 540 composed of only the second cooling units are disposed to extend to the edges of each semiconductor chip 510. The semiconductor chips 510 are vertically stacked in a manner such that their through-electrodes 520 are connected to each other.

Meanwhile, although not shown in the drawing, each of the stacked semiconductor chips 510 has bonding pads disposed on the upper surface thereof. The bonding pads are electrically connected to the through-electrodes 520 directly or by redistribution lines.

The substrate 550 has a plurality of bond fingers 552 disposed on the upper surface thereof and is formed with second cooling parts 560 on the upper surface thereof. The second cooling parts 560 have inlet or outlet portions 560a which are disposed on edges of the substrate 550. The second cooling parts 560 can be arranged throughout the surface of the substrate 550, excluding any portion of the substrate having the bond fingers 552. The bond fingers 552 of the substrate 550 are electrically connected to the through-electrodes 520 of the semiconductor chip 510 which is placed lowermost among the stacked semiconductor chips 510.

The third cooling parts 562 are disposed on both side surfaces of the stacked semiconductor chips 510. The third cooling parts 562 are connected to portions of the first cooling parts 540 which are positioned on the edges of the semiconductor chips 510 and to the second cooling parts 560 of the substrate 550. The connection between the first cooling parts 540 and the third cooling parts 562 and the connection between the second cooling parts 560 and the third cooling parts 562 are implemented by the medium of sealing members 570 made of polymer.

The encapsulant member 580 is formed to seal the upper surface of the substrate 550 including the stacked semiconductor chips 510. The external connection terminals 590 are attached to ball lands (not shown) which are disposed on the lower surface of to the substrate 550, as mounting means to external circuits.

In the semiconductor package having the stack structure in accordance with an embodiment of the present invention, due to the fact that the cooling parts are formed on the upper surfaces of the respective semiconductor chips, both sides surfaces of the stacked semiconductor chips and the upper surface of the substrate in a manner such that the cooling parts are connected with one another, the heat generated from the semiconductor chips including the through-electrodes can be easily dissipated to an outside through heat dissipation paths.

Further, in the semiconductor package in accordance with an embodiment of the present invention, it is possible to reduce the number of manufacturing processes, the manufacturing costs and the manufacturing time relative to a semiconductor device formed with microchannels. Also, in the semiconductor package in accordance with an embodiment of the present invention, due to the fact that the inlet or outlet portions define heat dissipation paths, the heat dissipation characteristics can be remarkably improved when compared to the conventional art, and the size of the semiconductor package can be reduced when compared to the conventional art.

In addition, in the semiconductor package in accordance with an embodiment of the present invention, since it is not necessary to define microchannels in the semiconductor chips, the to strength of the semiconductor chips is not reduced when implementing the cooling structure, whereby the semiconductor chips can be prevented from being damaged.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a semiconductor chip having a bonding pads on an upper surface thereof;
   a through-electrode formed in the semiconductor chip;
   a cooling part formed in the semiconductor chip and on the upper surface of the semiconductor chip; and
   a redistribution line formed on the upper surface of the semiconductor chip in such a way as to electrically connect the bonding pad to the through-electrode.

2. The semiconductor package according to claim 1, wherein the cooling part comprises:
   a first cooling unit which is formed in the semiconductor chip so as to surround each of the through-electrode; and
   a second cooling unit which is formed on the upper surface of the semiconductor chip.

3. The semiconductor package according to claim 2, wherein the first cooling unit is formed to contact the through-electrode.

4. The semiconductor package according to claim 2, wherein the first cooling unit is formed so as to surround each of the through electrode while being separated from the through-electrode so as to leave a space interposed between the first cooling unit and the through electrode.

5. The semiconductor package according to claim 2, wherein the first cooling unit is connected to the second cooling unit.

6. A semiconductor package comprising:
   at least two semiconductor chips each formed with through-electrodes therein, the at least two semiconductor chips being stacked such that the through-electrodes are electrically connected to each other;
   a first cooling part formed in and on an upper surface of each of the at least two semiconductor chips, wherein the first cooling parts comprise first cooling units which are formed in the semiconductor chip so as to surround each of the through-electrodes and a second cooling unit which are formed on the upper surface of the semiconductor chip;
   a substrate to be attached the stacked semiconductor chips thereto, the substrate having bond fingers which are connected to through-electrodes of a lowermost semiconductor chip of the at least two semiconductor chips; and
   a second cooling part formed on an upper surface of the substrate, including the periphery of the bond finger.

7. The semiconductor package according to claim 6, wherein the first cooling parts of the stacked semiconductor chips are connected to each other and to the second cooling part.

8. The semiconductor package according to claim 6, further comprising:
   a sealing member interposed between the first cooling parts of any two stacked semiconductor chips of the at least two semiconductor chips and interposed between the first cooling part of the lowermost semiconductor chip of the at least two semiconductor chips and the second cooling part so as to physically join the cooling parts.

9. The semiconductor package according to claim 8, wherein the sealing members comprise polymer.

10. The semiconductor package according to claim 6, wherein the first cooling unit is formed to contact the through-electrodes.

11. The semiconductor package according to claim 6, wherein the first cooling unit is formed so as to surround each of the through electrode while being separated from the through-electrode so as to leave a space interposed between the first cooling unit and the through electrode.

12. The semiconductor package according to claim 6, wherein the first cooling unit is connected to the second cooling unit.

13. The semiconductor package according to claim 6, wherein the second cooling part includes an inlet or outlet portion which is disposed on an edge of the substrate.

14. A semiconductor package comprising:
   at least two semiconductor chips each formed with through-electrodes therein, the at least two semiconductor chips being stacked such that through-electrodes are electrically connected to each other;
   a first cooling part formed on an upper surface of each of the at least two semiconductor chips;
   a substrate to be attached the stacked semiconductor chips thereto, the substrate having bond fingers which are connected to through-electrodes of a lowermost semiconductor chip of the at least two semiconductor chips;
   a second cooling part formed on an upper surface of the substrate, including the periphery of the bond finger; and
   a third cooling part disposed to contact with a side surface of the stacked semiconductor chips and connected to both the first cooling parts of the at least two semiconductor chips and the second cooling part.

15. The semiconductor package according to claim 4, wherein the first cooling parts, the second cooling part, and the third cooling part are connected to each other.

16. The semiconductor package according to claim 14, further comprising:
    sealing members interposed between the first cooling parts and the third cooling part and between the second cooling part and the third cooling part so as to physically join the cooling parts.

17. The semiconductor package according to claim 16, wherein the sealing members comprise polymer.

18. The semiconductor package according to claim 14, wherein the second cooling part includes an inlet or outlet portion which is disposed on an edge of the substrate.

* * * * *